United States Patent
Fereyre

(10) Patent No.: US 8,035,144 B2
(45) Date of Patent: Oct. 11, 2011

(54) COLOR IMAGE SENSOR WITH IMPROVED OPTICAL CROSSTALK

(75) Inventor: Pierre Fereyre, Voreppe (FR)

(73) Assignee: E2V Semiconductors (FR)

( * ) Notice: Subject to any disclaimer, the term of this patent is extended or adjusted under 35 U.S.C. 154(b) by 353 days.

(21) Appl. No.: 12/440,753

(22) PCT Filed: Sep. 19, 2007

(86) PCT No.: PCT/EP2007/059879
§ 371 (c)(1),
(2), (4) Date: Apr. 21, 2009

(87) PCT Pub. No.: WO2008/034838
PCT Pub. Date: Mar. 27, 2008

(65) Prior Publication Data
US 2010/0038740 A1    Feb. 18, 2010

(30) Foreign Application Priority Data
Sep. 19, 2006  (FR) .................................... 06 08185

(51) Int. Cl.
*H01L 31/062* (2006.01)
*H01L 31/113* (2006.01)
(52) U.S. Cl. ........................ 257/294; 257/444
(58) Field of Classification Search .......... 257/290–294, 257/431–448, E31.073, E31.127, E27.133
See application file for complete search history.

(56) References Cited

U.S. PATENT DOCUMENTS

| 5,172,206 | A | 12/1992 | Iizuka |
| 7,078,779 | B2 * | 7/2006 | Wang et al. .................... 257/432 |
| 7,235,833 | B2 * | 6/2007 | Chen ............................. 257/294 |
| 7,709,872 | B2 * | 5/2010 | Shiau et al. .................... 257/294 |
| 7,772,028 | B2 * | 8/2010 | Adkisson et al. ............... 438/98 |
| 2004/0079865 | A1 | 4/2004 | Hoshi |
| 2005/0218417 | A1 | 10/2005 | Takahashi |
| 2006/0081898 | A1 | 4/2006 | Wang et al. |
| 2006/0145219 | A1 | 7/2006 | Lim |
| 2006/0169878 | A1 | 8/2006 | Kasano et al. |

FOREIGN PATENT DOCUMENTS

| EP | 1566842 A | 8/2005 |
| EP | 1653520 A | 5/2006 |

* cited by examiner

*Primary Examiner* — Cuong Q Nguyen
(74) *Attorney, Agent, or Firm* — Lowe Hauptman Ham & Berner, LLP

(57) ABSTRACT

The invention relates to image sensors produced on a thinned silicon substrate. To limit the optical crosstalk between adjacent filters and, notably filters of different colors, the invention proposes positioning, between the adjacent filters of different colors (FR, FB, FV), a wall (20) of a material tending to reflect the light so that the light arriving obliquely on a determined filter corresponding to a first pixel does not tend to pass toward an adjacent filter or toward a photosensitive zone corresponding to an adjacent pixel but is returned by the wall to the first filter or the photosensitive zone corresponding to the first pixel. The wall is preferably made of a material with a high reflection coefficient such as aluminium and it is sunk depthwise into the thinned semiconductor layer (16), preferably in $p^+$ diffusions formed in the layer if it is of p-type.

20 Claims, 2 Drawing Sheets

COLOR IMAGE SENSOR WITH IMPROVED OPTICAL CROSSTALK

CROSS-REFERENCE TO RELATED APPLICATIONS

The present Application is based on International Application No. PCT/EP2007/059879, filed on Sep. 19, 2007, which in turn corresponds to French Application No. 0608185 filed on Sep. 19, 2006, and priority is hereby claimed under 35 USC §119 based on these applications. Each of these applications are hereby incorporated by reference in their entirety into the present application.

FIELD OF THE INVENTION

The invention relates to image sensors produced on a thinned silicon substrate. The thinning of the silicon on which the image sensor is made is a technique used to improve the crosstalk by minimizing any interference between adjacent image points, notably, for color sensors, points corresponding to different colors. The interference is reduced by the fact that the lighting is produced via the rear face and not via the front face of a silicon wafer. The front face is the one on which the operations of depositing and etching the layers forming most of the array of photodetectors and its control circuits are carried out. When color filters are deposited, they are closer to the photosensitive zones formed in the silicon.

BACKGROUND OF THE INVENTION

An image sensor on thinned silicon can be produced as follows: starting from a semiconductor wafer (silicon in principle, or silicon-on-insulator) on the front face before which operations are performed involving masking, implantations of impurities, depositions of layers of various provisional or definitive compositions, etching of these layers, heat treatment and so on; these operations make it possible to define an array of photosensitive pixels and electrical signal processing circuits associated with these pixels; the wafer is then bonded via its front face to the front face of a supporting substrate; most of the thickness of the semiconductor wafer is eliminated (such is the thinning operation), leaving on the front face of the support substrate a thin semiconductor layer comprising the photosensitive zones and the associated circuits; also, subsequently, various layers are deposited and etched on the rear face of the duly thinned semiconductor layer including, for example, an opaque metallic layer and a layer of color filters in mosaic form (for the color sensors).

It will be understood that, with this method, light does not arrive through a stock of insulating and conductive layers that might have been deposited (in CMOS technology, or another technology) on the photosensitive zones during the manufacturing of the semiconductor wafer. On the contrary, the light will arrive from the side of the rear face of the sensor, where appropriate pass through the color filters and directly reach the photosensitive zones without having to pass through the stack of insulating and conductive layers.

The residual thickness of the silicon after thinning is approximately 3 to 20 microns.

However, in practice, it is observed that there are crosstalk phenomena between adjacent pixels. The aim of the present invention is to further reduce the crosstalk defects, notably the colorimetry defects due to the crosstalk between adjacent pixels. This problem is all the greater when the surface area of the pixels is smaller.

The crosstalk can have optical causes (dispersion of photons to adjacent pixels as explained above) but also electronic causes; electronic crosstalk originates from the dispersion of electrons that are generated in a photosensitive zone corresponding to a determined pixel and that should be collected by an electrode corresponding to this pixel but that are in reality attracted by an electrode of a neighboring pixel because of the existence of electrical fields that are poorly controlled within the photosensitive zones.

SUMMARY OF THE INVENTION

The invention proposes to position, between the adjacent pixels, a wall of a material tending to reflect light so that the light arriving obliquely on a first pixel does not tend to pass to a photosensitive zone corresponding to an adjacent pixel but is returned by the wall to the photosensitive zone corresponding to the first pixel. The wall is preferably made of a strongly reflective material such as aluminum, but it would also be possible to envisage it being made of a transparent material, but one with a refractive index lower than that of the filters in order to allow total reflection of the light arriving at a sufficiently small oblique angle of incidence. According to the invention, the wall extends depthwise inside the single-crystal semiconductor layer in which the photosensitive zones are formed. In other words, the wall extends below the silicon surface corresponding to the photosensitive zones. Improvements in both the optically-induced crosstalk and the electronically induced crosstalk are thus combined, because the wall at least partly prevents the passage of photogenerated charges from one pixel to an adjacent pixel.

Thus, the invention proposes an image sensor with thinned semiconductor layer lit via the opposite face to the face by which a network of photosensitive zones and circuitry have been formed for collecting the charges photogenerated by these zones, characterized in that said opposite face comprises, around each photosensitive zone, a wall of material reflecting the light, this wall extending depthwise into the thinned semiconductor layer. In the case of a color image sensor comprising a network of color filters of different colors deposited on top of a semiconductor layer comprising a photosensitive zone associated with each filter, each color filter is separated from adjacent filters of different color by the wall of light-reflecting material.

The wall reduces both photonic and electronic crosstalk between adjacent pixels, all the more so as it extends deeper into the layer. Such a wall sunk into the silicon could not have been envisaged in practice with non-thinned sensors, because it would have disrupted the diffusions and the electrical circuitry situated on the side of the non-thinned face.

The separating wall preferably penetrates a semiconductor zone (silicon in principle) of $p^+$-type implanted or diffused into the semiconductor layer on the side of the lit face, of n-type, containing the photosensitive zones, the $p^+$ diffused zone itself forming a partial electrical separation between adjacent photosensitive zones.

The sunk-in part of the wall can also be surrounded by an insulating layer.

The top part of the reflecting wall preferably comprises a coating of an antireflection material. This material is preferably titanium nitride.

If the sensor is a color image sensor, it comprises color filters each associated with a respective photosensitive zone and laterally separated from each other by the reflecting wall.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

The invention will be described with respect to a color image sensor, but it can also be applied to a black-and-white sensor without any color filters on the thinned face.

Figure 1:
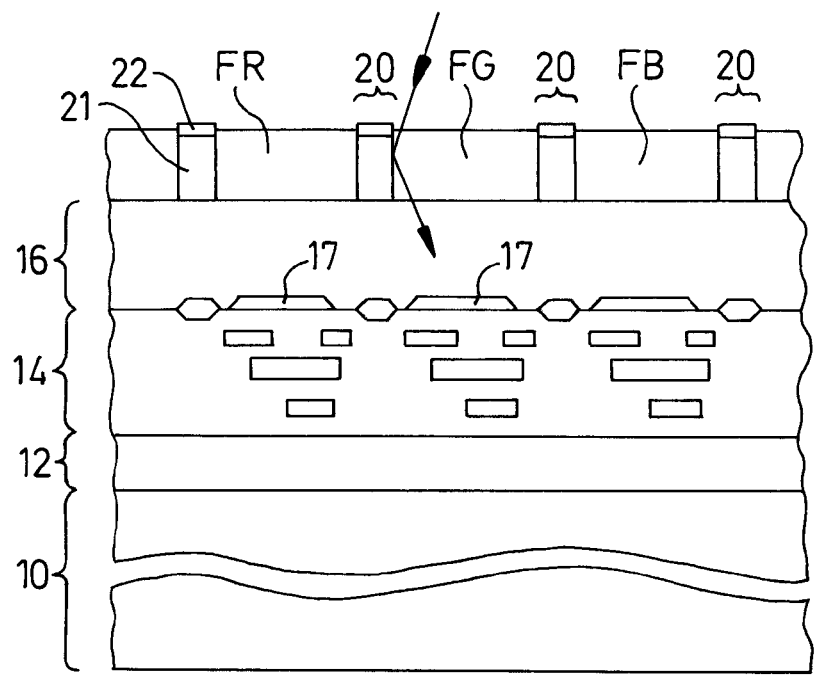
FIG. 1 represents a schematic cross section of an image sensor with thinned semiconductor substrate.

FIG. 1 shows, in lateral cross section, the schematic structure of a color image sensor of thinned type whose pixels are produced using CMOS technology.

The sensor comprises a support substrate 10 covered by a planarization layer 12 which is itself covered by a set of conductive and insulating layers serving to collect the electrical charges generated by each pixel; the set of conductive and insulating layers is represented schematically and is designated by a reference 14; the precise structure and configuration of these layers depends on the electrical construction of each pixel; for example, it is possible to provide pixels with three or four or five transistors and it will be understood that the conductive layers used to form these transistors have topologies that are suited to the construction of the pixel; there can be, for example, four or five conductive levels separated by insulating layers, with conductive vias to link the levels to each other where they need to be linked.

The set 14 of conductive and insulating layers is covered by a semiconductor layer 16, in principle of silicon, in which are formed the photosensitive zones making it possible to generate and collect electrical charges under the influence of the light. Typically, the photosensitive zones are made up of photodiodes, a photodiode being associated with each pixel; the photodiodes are constructed from an n-type diffusion 17 into the p-type silicon that constitutes the layer 16; it is the n-type diffusion that makes it possible to collect the electrical charges photogenerated in the p-type layer 16 and it is possible to consider that a photosensitive zone is made up of a portion of p-type layer 16 situated above a diffused region 17 of n-type. The conductivity types could all be reversed without changing the operating principle.

The individual color filters are deposited above the semiconductor layer 16, generally in the form of a three-color mosaic; the filters are in principle grouped into sets of four adjacent filters, including two filters of one and the same color (most commonly green) which are diagonally opposed whereas the other two diagonally opposed filters correspond to two other colors (generally blue and red). Staggered arrangements are sometimes used. The outlines of the filters can be square or hexagonal. There is a color filter above each basic photosensitive zone or pixel.

The figure shows three adjacent pixels corresponding to the three colors: green, red and blue; the filters are designated FG (color green), FR (color red), FB (color blue).

The silicon layer 16 is a thinned layer formed using a known technique reviewed hereinabove: the diffusions 17 and the stacking of insulating and conductive layers 14 serving to collect the charges photogenerated in the photosensitive zones have been formed via what is called the front face of a semiconductor substrate (i.e. the face turned downward in the figure); then, this front face has been bonded to the support substrate 10; then, the silicon of the semiconductor substrate has been thinned via its rear face (i.e. the face turned upward in the figure) until only a few microns of residual thickness (typically 3 to 20 microns) are left. The photosensitive zones are lit via the rear face of the layer 16, therefore from above in FIG. 1, i.e., via the face that does not include the stack 14.

The adjacent filters of different colors are separated by a reflecting wall 20. This wall is preferably formed by an aluminum wall 21 covered by a thin layer of titanium nitride 22, the latter acting as an antireflection layer to prevent the incident light from an image source being returned to that source.

The light arriving under normal incidence above a filter passes through this filter and reaches the photosensitive zone corresponding to that filter. The light arriving on the edges of a filter under oblique incidence is returned to the photosensitive zone that corresponds to the filter instead of passing to the photosensitive zone corresponding to the adjacent filter.

To put in place the filters surrounded by an aluminum wall, on a thinned image sensor, it is possible to proceed as follows:

a uniform aluminum layer is deposited on the rear face of the sensor, that is, on the accessible face of the layer of silicon 16 that comprises the photosensitive zones;

a titanium nitride layer is deposited on top of the aluminum layer;

a layer of photoresist is deposited, which is etched according to a pattern corresponding to the walls to be produced by allowing the resist above the positions of the walls to remain;

the titanium nitride is etched where it is not protected by the resist, with an etchant that removes the titanium nitride without significantly etching the resist; then, in the same way, the aluminum is removed with an etchant that removes the aluminum without etching the resist;

the resist is removed;

a layer of a colored resist of a first color is deposited, and it is etched by a photolithographic method to allow it to remain only inside the locations surrounded by aluminum walls and reserved for the filters of the color concerned;

a layer of a colored resist of a second color is deposited, and it is etched by a photolithographic method to allow it to remain only inside the locations surrounded by aluminum walls and reserved for the filters of the second color; and a layer of a colored resist of a third color is deposited, and it is etched by photolithography to allow it to remain only inside the locations surrounded by aluminum walls and reserved for the filters of the third color.

These color filter deposition and etching steps are conventional for all color image sensors, but in this case the color filters are deposited inside spaces surrounded by aluminum walls. If the sensor is not a color sensor, the filter deposition and etching steps are not provided.

It is possible, as a variant, to form the aluminum walls as follows: a sacrificial layer is deposited, for example of silicon oxide, that is opened at a place where the reflecting walls are to be produced, aluminium that fills the duly-produced openings is deposited, the excess aluminum present outside the openings is shaped, and the sacrificial layer is removed using an etchant that eliminates this layer while not attacking the aluminum, therefore leaving the aluminum walls intact. Titanium nitride (antireflection layer) can be deposited and etched before the removal of the sacrificial layer, in which case the etchant for the sacrificial layer must not attack the titanium nitride.

Figure 2:
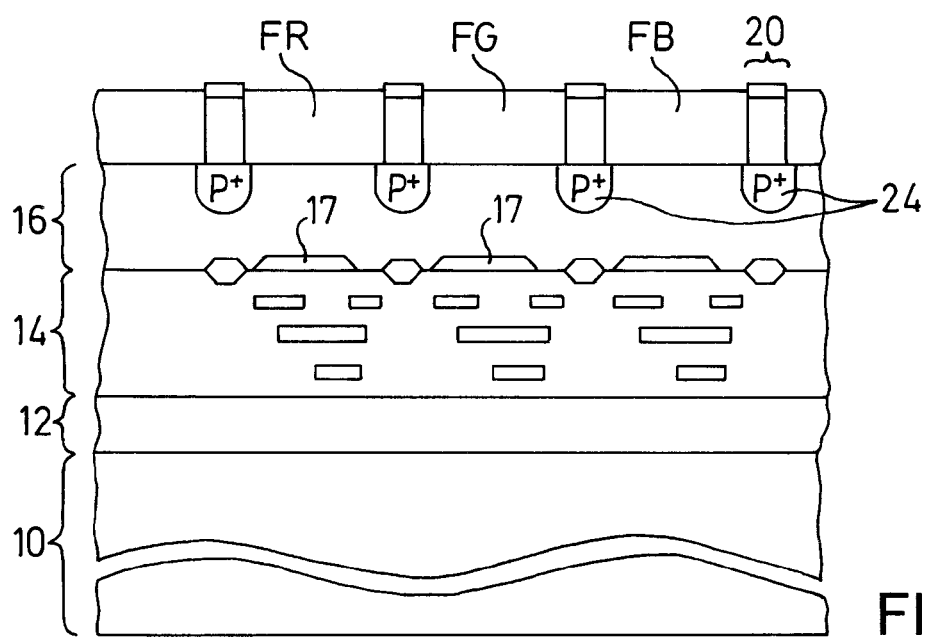
FIG. 2 represents a variant embodiment in which the reflecting walls cover a diffused $p^+$-type region.

To improve the electronic crosstalk, i.e. to limit the risks of dispersion of the electrons toward photosensitive zones adjacent to that where they have been generated by the light, it is also possible, as shown by FIG. 2, to provide a $p^+$ type doping that is sunk into the p-type semiconductor layer 16, above the reflecting walls. This doping creates regions 24 that at least partially separate from each other the adjacent photosensitive zones defined in the semiconductor layer 16; the $p^+$ regions in effect create a repulsive electric field for the electrons, tending to keep the latter in the photosensitive zone where they have been generated, until they are collected by the space charge zone formed in the substrate and the diffused region 17 around the junction of the photodiode associated with this photosensitive zone. The regions 24 are formed before the deposition of the aluminum layer that is used to form the reflecting walls. They can in particular be formed after the opening of the sacrificial layer mentioned above, with the advantage of a perfect alignment.

The $p^+$ regions 24 are implanted in the accessible face of the semiconductor layer after the opposite face (the one supporting the stack of conductive and insulating layers 14) is applied to the support substrate 10. The reflecting walls 20 are formed after the production of the doped regions 24.

Figure 3:
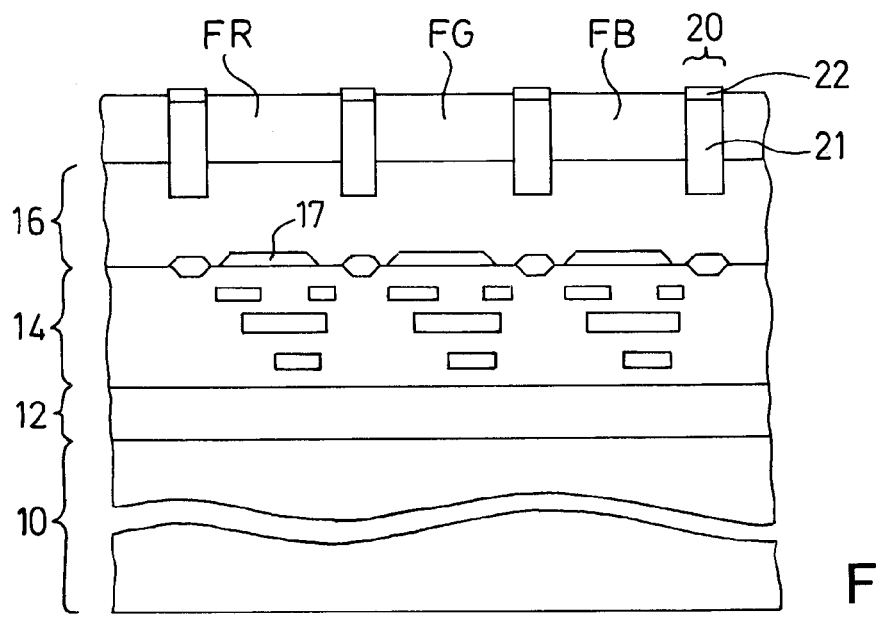
FIG. 3 represents a sensor according to the invention in which the reflecting walls are partially sunk into the silicon.

In the invention represented in FIG. 3, provision is made for the reflecting walls 20 to be partly sunk into the semiconductor layer 16. This sinking-in improves the optical crosstalk and also helps to electrically separate the adjacent photosensitive zones: it therefore contributes to reducing the electronic crosstalk between adjacent pixels. To produce the structure in this case, openings in the layer 16 of silicon are hollowed out before depositing the aluminum layer. The etching mask for hollowing out these openings is the same as the etching mask for the sacrificial layer that defines the position of the walls.

Figure 4:
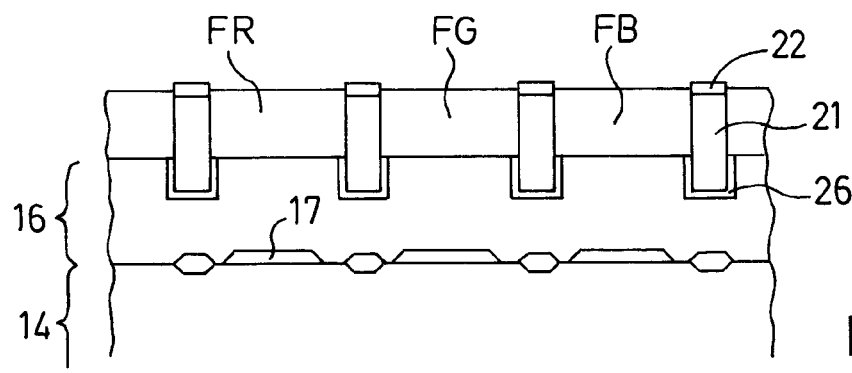
FIGS. 4 and 5 represent variants in which the sunk-in part of the wall is surrounded by an insulating layer or by a diffused $p^+$-type region.

In a variant, derived from FIG. 3 and represented in FIG. 4, the sunk-in part of the reflecting walls is insulated from the silicon, in order for the aluminum walls not be directly in electrical contact with the silicon; this insulation is provided, for example, by a silicon oxide layer 26. The sunk-in and insulated part of the reflecting walls creates a separation between adjacent photosensitive zones, improving the electrical crosstalk.

Figure 5:
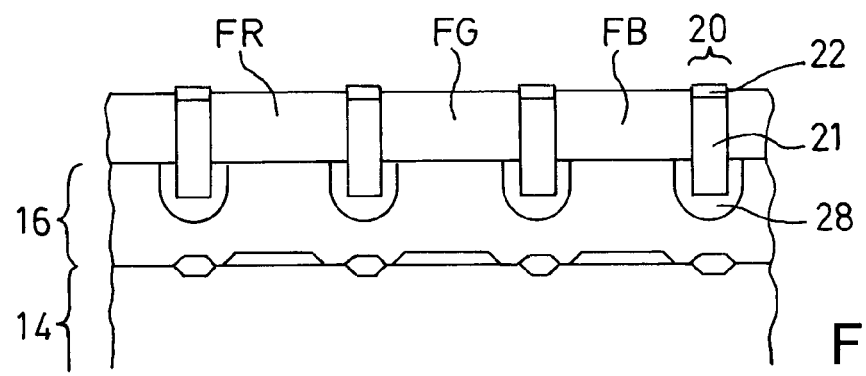

In the variant represented in FIG. 5, provision is made for the sunk-in part of the reflecting walls to be surrounded by a doped region 28 of $p^+$-type providing the same separation function between adjacent photosensitive zones as the region 24 of FIG. 2. The implantation or diffusion-based silicon-doping operation that is used to form the regions 28 can be carried out before or after the etching of openings in the silicon of the layer 16 (openings designed to receive the sunk-in part of the aluminum walls 20).

The $p^+$-doped region 28, like the insulating layer 26 of FIG. 4, also makes it possible to avoid having the aluminum come into direct contact with the less p-doped layer that is used to generate the photosensitive charges. In effect, the defects that would be created at the aluminum-silicon interface would generate harmful dark currents. The $p^+$ region provides for an immediate recombination of the carriers generated by these defects.

It should be noted that a more conventional image sensor structure with non-thinned silicon would not normally allow for such reflecting walls sunk into the depth of the silicon layer to be produced, because the sinking-in of the walls would significantly disrupt the structure if it were carried out on the side where the diffusions 17 and the stacks of conductive and insulating layers 14 used to form the pixels had been made.

Finally, in the pixels with active MOS transistors that generally comprise a charge storage zone associated with the photodiode, it may be desirable to avoid as far as possible having this storage area receive direct lighting. This is why it is advantageously proposed that the reflecting walls should have a perimeter that surrounds not all of the pixel but more specifically the outline of the actual photosensitive zone, by entirely covering the rest of the elements of the pixel (transistors and charge storage zone). The layer of aluminum or of another reflecting material thus occupies all or almost all the space existing between the photodiodes of the adjacent pixels, the color filters then covering only the photodiodes defined by the diffused regions 17.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An image sensor with thinned semiconductor layer lit via the opposite face to the face by which a network of photosensitive zones and circuitry for collecting the charges photogenerated by these zones have been formed, wherein said opposite face comprises, around each photosensitive zone, a wall of material reflecting the light, this wall extending depthwise into the thinned semiconductor layer.

2. The image sensor as claimed in claim 1, wherein the wall is made from aluminum.

3. The image sensor as claimed in claim 1, wherein the top part of the wall is formed by a surface layer of antireflection material.

4. The image sensor as claimed in claim 1, wherein the wall is sunk into a $p^+$-type semiconductor zone formed in the semiconductor layer containing the photosensitive zones, this layer being of p-type.

5. The image sensor as claimed in claim 1, wherein the wall is sunk into an insulating layer.

6. The image sensor as claimed in claim 1, wherein the wall occupies substantially all the space that exists between photodiodes of the adjacent pixels, the color filters covering only the photodiodes.

7. The color image sensor as claimed in claim 1, further comprising color filters, each associated with a respective photosensitive zone and laterally separated from each other by the reflecting wall.

8. The image sensor as claimed in claim 6, wherein the top part of the wall is formed by a surface layer of antireflection material.

9. The image sensor as claimed in claim 6, wherein the wall is sunk into a $p^+$-type semiconductor zone formed in the semiconductor layer containing the photosensitive zones, this layer being of p-type.

10. The image sensor as claimed in claim 6, wherein the wall is sunk into an insulating layer.

11. The image sensor as claimed in claim 7, wherein the top part of the wall is formed by a surface layer of antireflection material.

12. The image sensor as claimed in claim 7, wherein the wall is sunk into a $p^+$-type semiconductor zone formed in the semiconductor layer containing the photosensitive zones, this layer being of p-type.

13. The image sensor as claimed in claim 7, wherein the wall is sunk into an insulating layer.

14. The image sensor as claimed in claim 3, wherein said antireflection layer is made of titanium nitride.

15. The image sensor as claimed in claim 8, wherein said antireflection layer is made of titanium nitride.

16. The image sensor as claimed in claim 11, wherein said antireflection layer is made of titanium nitride.

17. The image sensor as claimed in claim 2, wherein the wall is sunk into a $p^+$-type semiconductor zone formed in the semiconductor layer containing the photosensitive zones, this layer being of p-type.

18. The image sensor as claimed in claim 3, wherein the wall is sunk into a $p^+$-type semiconductor zone formed in the semiconductor layer containing the photosensitive zones, this layer being of p-type.

19. The image sensor as claimed in claim 2, wherein the wall is sunk into an insulating layer.

20. The image sensor as claimed in claim 3, wherein the wall is sunk into an insulating layer.

* * * * *